US009137067B1

(12) United States Patent
Xie et al.

(10) Patent No.: US 9,137,067 B1
(45) Date of Patent: Sep. 15, 2015

(54) HIGH EFFICIENCY OUTPHASING TRANSMITTER FOR ELECTRONICALLY SCANNED ARRAYS

(71) Applicants: Chenggang Xie, Marion, IA (US); Theodore J. Hoffmann, Hiawatha, IA (US); Anders P. Walker, Marion, IA (US)

(72) Inventors: Chenggang Xie, Marion, IA (US); Theodore J. Hoffmann, Hiawatha, IA (US); Anders P. Walker, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 14/109,377

(22) Filed: Dec. 17, 2013

(51) Int. Cl.
*H04L 27/20* (2006.01)
*H04B 7/00* (2006.01)
*H03F 3/24* (2006.01)
*H04B 1/02* (2006.01)

(52) U.S. Cl.
CPC ........ *H04L 27/20* (2013.01); *H03F 3/24* (2013.01); *H04B 7/00* (2013.01); *H04B 1/02* (2013.01)

(58) Field of Classification Search
CPC .............. H04B 7/00; H04B 1/00; H04B 1/02; H04B 2001/0408; H04L 27/20; H04L 5/00; H03F 3/24
USPC .................. 375/259–260, 267, 295, 297, 299
See application file for complete search history.

(56) References Cited

U.S. PATENT DOCUMENTS

| | | | | |
|---|---|---|---|---|
| H173 H * | 12/1986 | Claborn et al. | ............... | 342/372 |
| 4,835,493 A * | 5/1989 | Walsh, Jr. | ..................... | 332/151 |
| 5,329,301 A * | 7/1994 | Balzeit et al. | ................ | 346/134 |
| 6,031,022 A * | 2/2000 | Martin et al. | ................. | 523/161 |
| 6,133,788 A * | 10/2000 | Dent | ......................... | 330/124 R |
| 6,825,719 B1 * | 11/2004 | Barak et al. | .................. | 330/129 |
| 7,684,776 B2 * | 3/2010 | Nation | ........................ | 455/276.1 |
| 8,290,086 B2 * | 10/2012 | Bose et al. | ..................... | 375/298 |
| 8,872,719 B2 * | 10/2014 | Warnick | ........................ | 343/853 |
| 2003/0034916 A1 * | 2/2003 | Kwon et al. | .................... | 342/372 |
| 2003/0162566 A1 * | 8/2003 | Shapira et al. | ............... | 455/561 |
| 2003/0227353 A1 * | 12/2003 | Fayyaz | ........................... | 333/161 |
| 2004/0263242 A1 * | 12/2004 | Hellberg | ........................... | 330/2 |
| 2005/0156800 A1 * | 7/2005 | Sankaranarayanan | ......... | 343/753 |
| 2005/0280466 A1 * | 12/2005 | Gailus et al. | ................. | 330/124 R |
| 2009/0012768 A1 * | 1/2009 | Son et al. | ........................ | 703/13 |
| 2009/0034603 A1 * | 2/2009 | Lakdawala et al. | .......... | 375/238 |
| 2009/0262037 A1 * | 10/2009 | Matyas et al. | ................ | 343/779 |
| 2010/0074367 A1 * | 3/2010 | Kim et al. | ..................... | 375/296 |
| 2010/0171674 A1 * | 7/2010 | Henderson | .................... | 343/778 |
| 2010/0244949 A1 * | 9/2010 | Gustavsson et al. | ...... | 330/124 R |
| 2010/0301933 A1 * | 12/2010 | Lejon | ........................ | 330/124 R |
| 2011/0102262 A1 * | 5/2011 | Haskell | ........................ | 342/372 |
| 2012/0033559 A1 * | 2/2012 | Kim | ............................... | 370/241 |

(Continued)

*Primary Examiner* — Jean B Corrielus
(74) *Attorney, Agent, or Firm* — Angel N. Gerdzhikov; Donna P. Suchy; Daniel M. Barbieri

(57) ABSTRACT

High efficiency transmitters for electronically scanned arrays (also known as electronically steered antennas or ESAs) are disclosed. The transmitters in accordance with the present disclosure utilize outphasing power amplification. In one embodiment, the outphasing transmitter includes a phase shifting device. The phase shifting device is configured for phase shifting an input signal and providing a pair of phase shifted signals for each emitting element of the EAS. The outphasing transmitter also includes an outphasing power amplifier associated with each emitting element. Each outphasing power amplifier is configured for separately amplifying the pair of shifted signals for each emitting element and combining the separately amplified signals for each emitting element for transmission.

12 Claims, 4 Drawing Sheets

(56) References Cited

U.S. PATENT DOCUMENTS

| | | | |
|---|---|---|---|
| 2012/0050107 A1* | 3/2012 | Mortazawi et al. | 342/372 |
| 2012/0155573 A1* | 6/2012 | Pruvost | 375/302 |
| 2012/0207252 A1* | 8/2012 | Levesque et al. | 375/342 |
| 2012/0319901 A1* | 12/2012 | Pruett et al. | 342/372 |
| 2013/0033296 A1* | 2/2013 | Kishimoto | 327/237 |
| 2013/0147664 A1* | 6/2013 | Lin | 342/372 |
| 2013/0176186 A1* | 7/2013 | Yaccarino et al. | 343/787 |
| 2013/0314280 A1* | 11/2013 | Maltsev et al. | 342/368 |
| 2014/0266465 A1* | 9/2014 | Kermalli | 330/295 |
| 2014/0334531 A1* | 11/2014 | Jeckeln | 375/240 |

* cited by examiner

HIGH EFFICIENCY OUTPHASING TRANSMITTER FOR ELECTRONICALLY SCANNED ARRAYS

TECHNICAL FIELD

The present disclosure relates generally to electronically scanned arrays, and more particularly to utilizing outphasing transmitter for electronically scanned arrays.

BACKGROUND

An active electronically scanned array (ESA), also known as an active electronically steered antenna, is a type of phased array whose transmitter and receiver functions are composed of numerous small solid-state transmit/receive modules. Active ESAs aim their beam by emitting separate radio waves from each module that interfere constructively at certain angles in front of the antenna. Another type of ESA, referred to as the passive ESA, is a phased array which has a central radio frequency source (such as a magnetron, a klystron, a travelling wave tube or solid state amplifier), sending energy into (usually digitally controlled) phase shift modules, which then send energy into the various emitting elements in the front of the antenna.

An ESA will be confined to a limited area set by its application and platform installation. The pitch between adjacent elements is about half of the wavelength of the carrier and as frequency increases, the pitch between adjacent elements decreases. The efficiency of the transmitter typically degrades over the frequency. Therein lies a need to provide high efficiency transmitters for ESAs.

SUMMARY

The present disclosure is directed to an outphasing transmitter for an ESA. The outphasing transmitter includes a phase shifting device. The phase shifting device is configured for phase shifting an input signal and providing a pair of phase shifted signals for each emitting element of the EAS. The outphasing transmitter also includes an outphasing power amplifier associated with each emitting element. Each outphasing power amplifier is configured for separately amplifying the pair of shifted signals for each emitting element and combining the separately amplified signals for each emitting element for transmission.

Another embodiment of the present disclosure is directed to an outphasing transmitter for an ESA. The outphasing transmitter includes an outphasing power amplifier configured for amplifying an input signal utilizing outphasing amplification to produce an amplified input signal. The outphasing transmitter also includes a splitter in communication with the outphasing power amplifier, wherein the splitter is configured for splitting the amplified input signal into a plurality of signals for a plurality of emitting elements. The outphasing transmitter further includes a plurality of phase shifters, and each of the plurality of phase shifters is configured for phase shifting a particular signal of the plurality of signals based on a particular offset phase.

A further embodiment of the present disclosure is directed to a method for utilizing outphasing amplification in an ESA. The method includes: phase shifting an input signal and providing a pair of phase shifted signals for each emitting element of the plurality of emitting elements; separately amplifying the pair of shifted signals for each emitting element; and combining the separately amplified signals for each emitting element for transmission.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DETAILED DESCRIPTION

Reference will now be made in detail to exemplary embodiments of the disclosure, examples of which are illustrated in the accompanying drawings.

Figure 1:
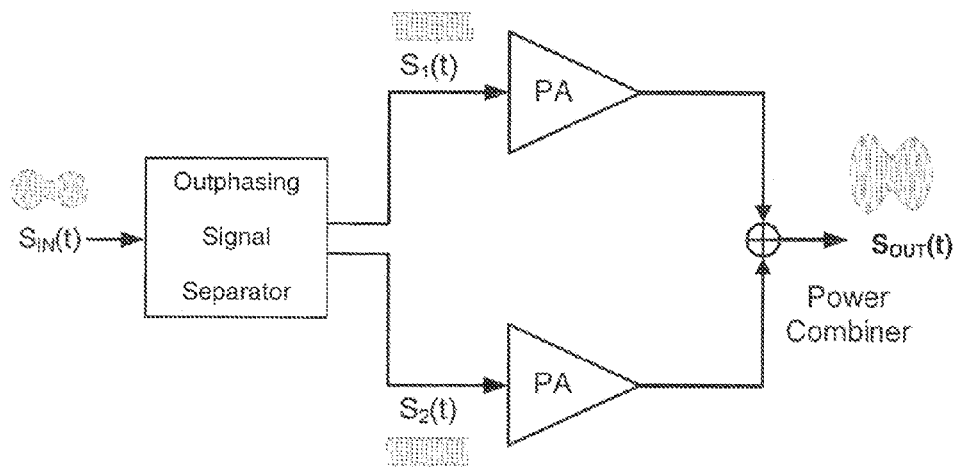
FIG. 1 is an illustration depicting an outphasing power amplification technique.

The present disclosure is directed to high efficiency transmitters for electronically scanned arrays (also known as electronically steered antennas or ESAs). The transmitters in accordance with the present disclosure utilize outphasing power amplification. Outphasing power amplification is a complex (amplitude and phase) modulation technique achieved by summing a pair of constant amplitude and phase modulated carriers. As illustrated in FIG. 1, outphasing power amplification operates by representing an amplitude and phase modulated signal, $S_{IN}(t)$, as two phase modulated signals, $S_1(t)$ and $S_2(t)$, utilizing an outphasing signal separator. The outphasing signal separator can be performed with analog or digital signal processing or a combination thereof. The two signals can then be amplified separately through power amplifiers (PAs) and combined to produce the output signal. Implementing outphasing power amplification in accordance with the present disclosure significantly improves the overall efficiency of the transmitter array by not only increasing the efficiency of individual element, but also digitally adjusting the elements for optimal operation.

Figure 2:
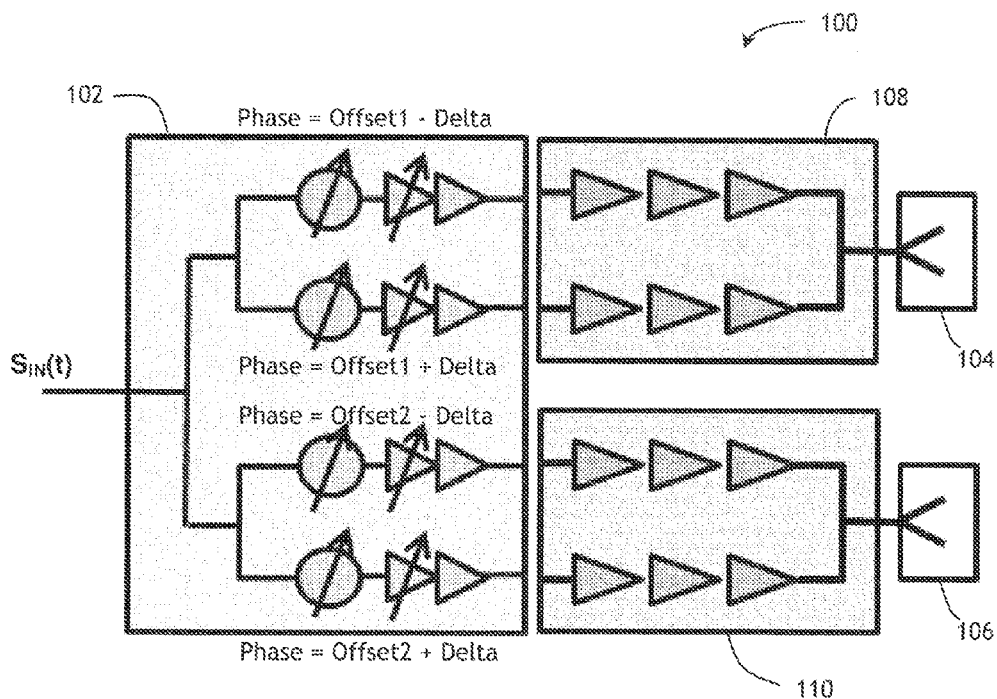
FIG. 2 is an illustration depicting an outphasing transmitter for an active electronically scanned array.

Referring to FIG. 2, a block diagram depicting an outphasing transmitter 100 for an ESA is shown. The ESA utilizes a plurality of emitting elements. A phase shifting device 102 is utilized for phase shifting signals for the various emitting elements of the ESA. For illustrative purposes, two emitting elements 104 and 106 are depicted in the simplified block diagram shown in FIG. 2. It is contemplated that phase shifting among the emitting elements 104 and 106 (referred to as the offset between them) is programmable and can be determined as a part of the operation of the ESA. For instance, phase shifting among the emitting elements 104 and 106 may be set in a particular manner in order to steer the beam of the ESA to a certain direction.

It is contemplated that the number of emitting elements utilized by the ESA may be greater than two, and in such configurations, the phase shifting device 102 may be utilized to provide phase shifting for various emitting elements based on various offset values. As mentioned above, the offset values for the various emitting elements can be programmable and can be determined as a part of the operation of the ESA without departing from the spirit and scope of the present disclosure. It is also understood that the signals provided to certain emitting elements may not need to be offset (again, how to offset the emitting elements is determined as a part of the ESA operation), and for such emitting elements, the offset phase may be set to zero.

In addition to providing offset phase shifting among the various emitting elements, the phase shifting device 102 also applies additional phase shifting for each particular emitting element. This additional phase shifting is referred to as the "delta phase" in the present disclosure, which is used to generate a pair of signals for an outphasing amplifier associated with each particular emitting element of the ESA. More specifically, as shown in FIG. 2, the pair of signals generated for emitting element 104 is provided to the outphasing power amplifier 108 associated with the emitting element 104, and the pair of signals generated for emitting element 106 is provided to the outphasing power amplifier 110 associated with the emitting element 106. In this manner, each outphasing power amplifier (108 and 110 in this example) then amplifies the "− delta" and "+ delta" phase shifted signals separately through power amplifiers (PAs) and combines the signals to produce the amplified signal to be transmitted by its corresponding emitting element (104 and 106 in this example, respectively).

It is contemplated that utilizing outphasing power amplifiers 108 and 110 as described above improves the overall efficiency of the transmitter array by not only increasing the efficiency of individual element but also digitally adjusting the elements for optimal operation. In the outphasing topology, each power amplifier can be tuned individually to maximize its efficiency. In addition, it is contemplated that the delta phase value can be programmable and can be adjusted to maintain the efficiency of the ESA and account for gain imbalance and/or phase imbalance between the amplifier pairs. For instance, the delta phase value can be set to provide the maximum power-added efficiency (PAE) or the desired power output. It is also contemplated that adjusting the delta phase value in turn adjusts the output power of the ESA without having to change the input power. This allows the output power of the ESA to be adjusted while still maintaining its efficiency, even when the power is back off from the peak. Furthermore, using the outphasing transmitters as described above still allows the output power to be adjusted by changing the input power if needed.

It is understood that while the block diagram shown in FIG. 2 depicts a configuration that utilizes a pair of phase shifters and variable gain amplifiers for each amplifier, such a configuration is merely exemplary. It is contemplated that a phase shifting device in accordance with the present disclosure may be implemented in various manners as long as a pair of phase shifted signals is provided for an outphasing amplifier associated with each emitting element of the ESA.

Figure 3:
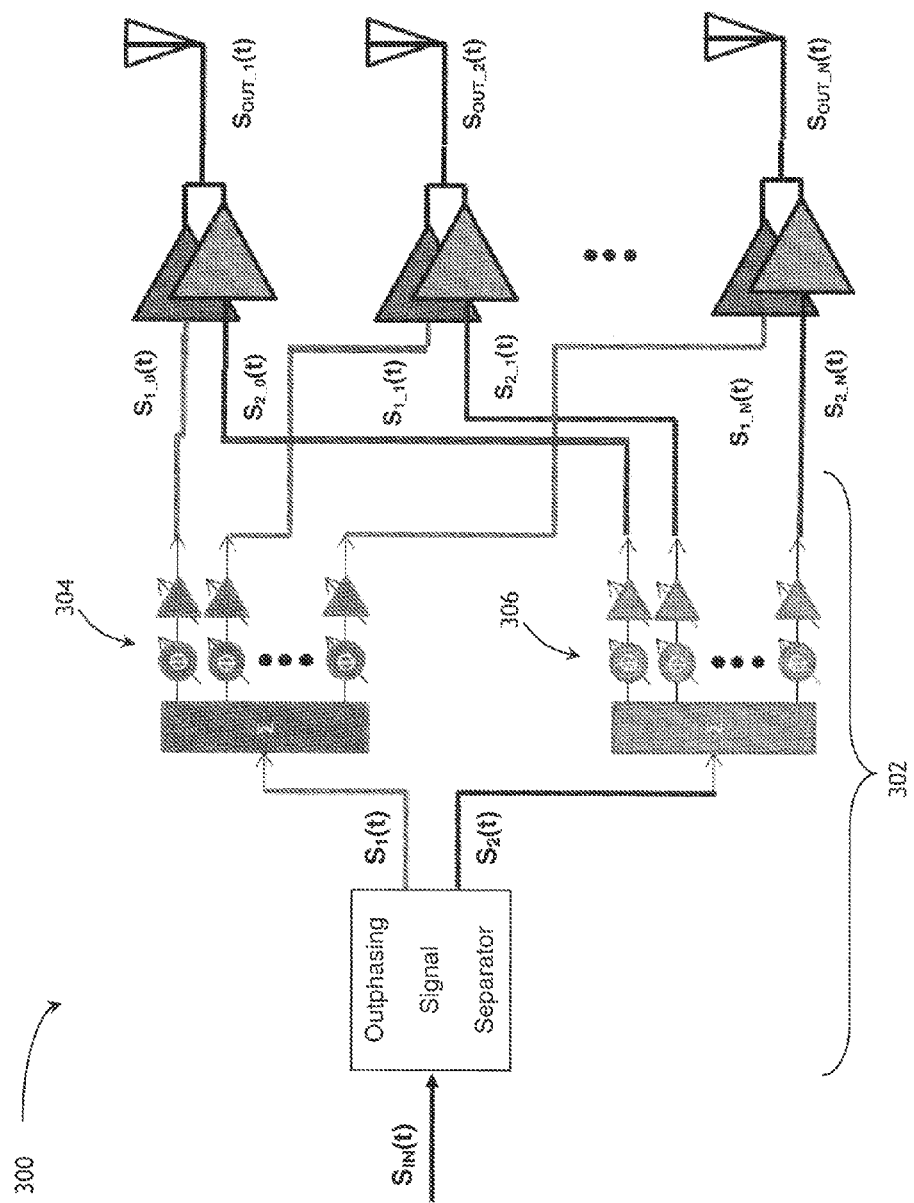
FIG. 3 is an illustration depicting another outphasing transmitter for an active electronically scanned array.

Referring to FIG. 3, a schematic depicting an alternative phase shifting device 302 for an outphasing transmitter 300 is shown. Different from the phase shifting device 102 depicted in FIG. 2, "delta phase" shifting in FIG. 3 is applied first to produce a signal pair A and B, and each of A and B is then phase shifted according to the offset values corresponding to the various emitting elements. More specifically, the input signal may be separated into a pair of signals A and B using linear amplification with nonlinear components or the like. This pair of signals correspond to the "− delta" and "+ delta" phase shifted signals as described above, and each of the pair of signals (A and B) is then provided to its corresponding phase shifter and variable gain amplifier circuit (304 and 306, respectively) to provide phase shifted signals for the various emitting elements of the ESA.

Regardless of the differences between the implementations shown in FIGS. 2 and 3, it is noted that in both implementations, one pair of phase shifted signals is provided for the outphasing amplifier associated with each emitting element of the ESA. As previously described, phase shifting among the various emitting elements can be adjusted to electronically steer the beam, amplitude relative from amplifier to amplifier can be adjusted to shape the beam, and the delta phase value can be adjusted to maintain the efficiency of the ESA and account for gain imbalance and/or phase imbalance between the amplifier pairs.

In one embodiment, the phase shifting device is implemented utilizing a multifunction silicon-germanium (SiGe) chip and the outphasing power amplifiers are implemented utilizing a gallium nitride monolithic microwave integrated circuit (GaN MMIC). The SiGe chip and the GaN MMIC may be further configured to support ESA operations in X-band. It is contemplated, however, that the phase shifting devices and the outphasing power amplifiers described above are merely exemplary, and various types of phase shifting devices and outphasing power amplifiers may be utilized to implement the outphasing transmitter without departing from the spirit and scope of the present disclosure.

Figure 4:
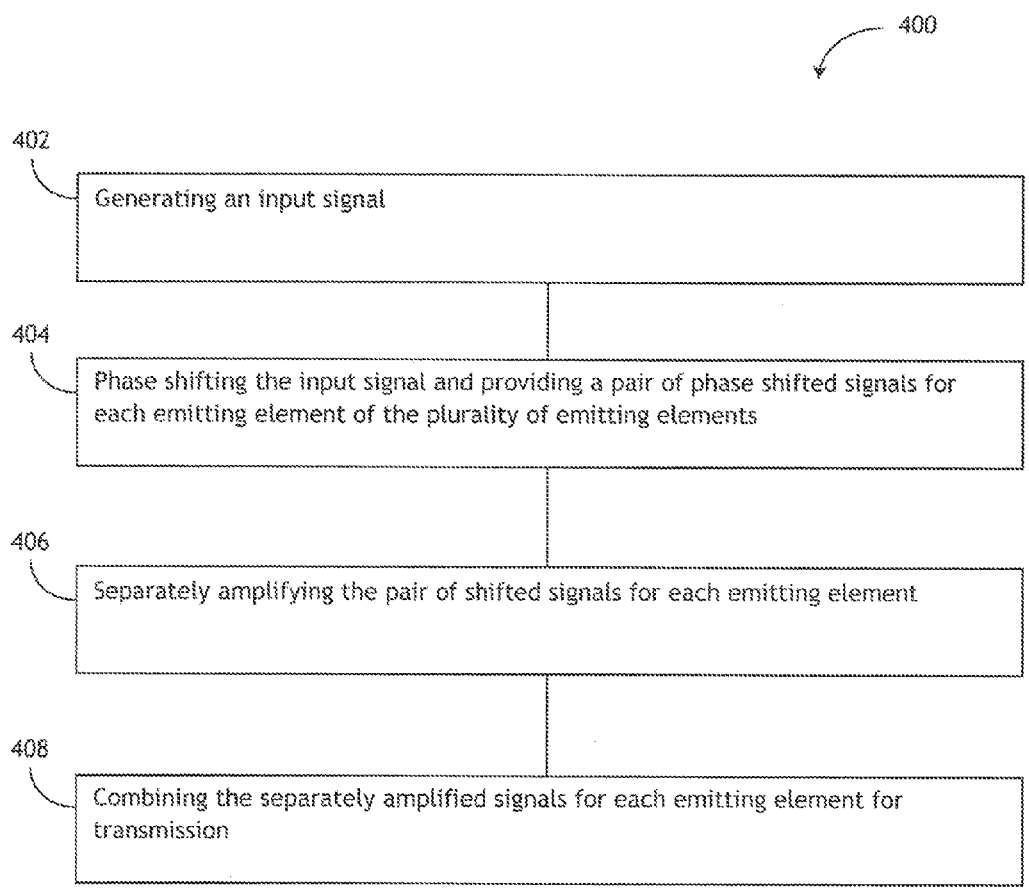
FIG. 4 is a flow diagram depicting a method for utilizing outphasing amplification in an electronically scanned array.

Referring now to FIG. 4, a flow diagram depicting a method 400 for utilizing outphasing amplification in an electronically scanned array (ESA) is shown. In accordance with the present disclosure, an ESA having a plurality of emitting elements is utilized to facilitate signal transmission. Upon generating an input signal in step 402, the input signal is phase shifted in step 404 to provide a pair of phase shifted signals for each emitting element of the plurality of emitting elements. As previously described, the pair of phase shifted signals generated for each emitting element may include: a first signal phase shifted by an offset phase for that particular emitting element minus a delta phase and a second signal phase shifted by the offset phase for that particular emitting element plus the delta phase. Also as previously described, each emitting element is associated with an outphasing power amplifier, which is configured to separately amplify the pair of shifted signals for that particular emitting element in step 406 and combine the separately amplified signals for each emitting element in step 408 for transmission.

Figure 5:
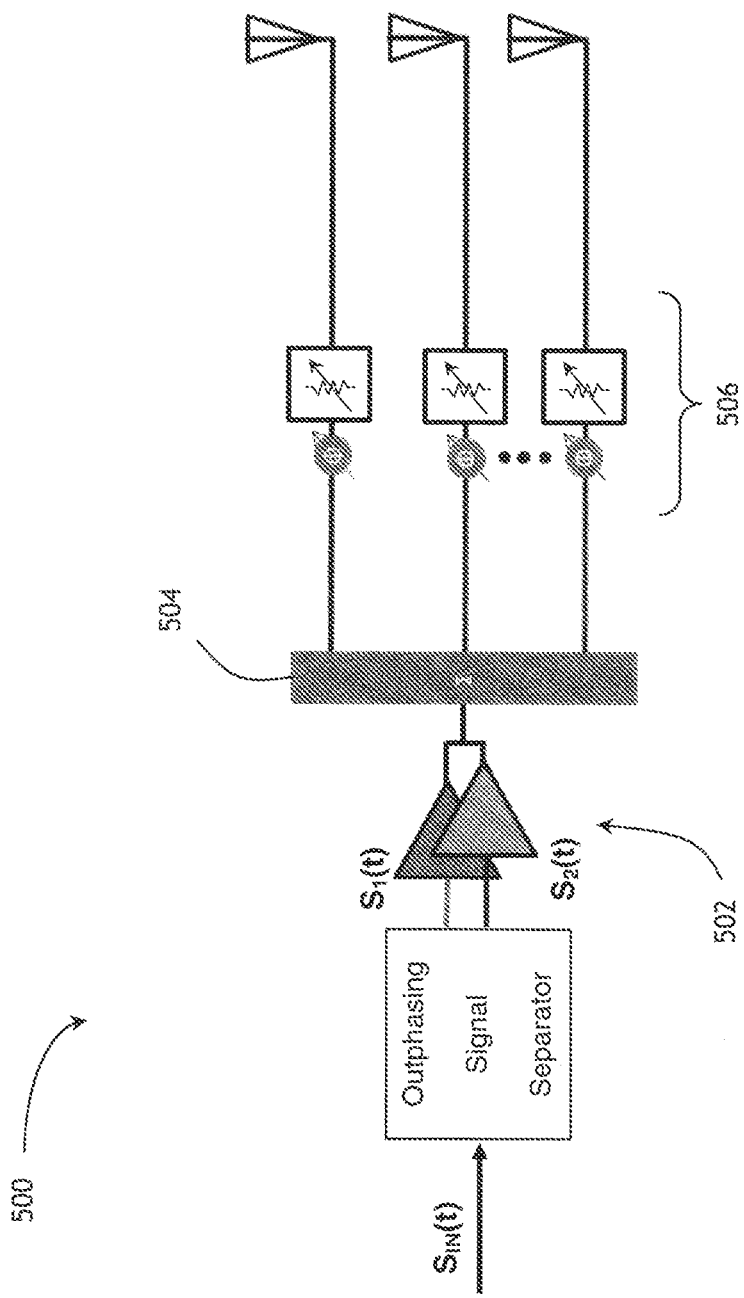
FIG. 5 is an illustration depicting an outphasing transmitter for a passive electronically scanned array.

Furthermore, it is contemplated that the outphasing power amplifier may be utilized in a similar manner as described above, but adapted for passive ESAs. Referring to FIG. 5, a schematic depicting an outphasing transmitter 500 for a passive ESA is shown. A passive ESA uses a central radio frequency source to send energy into phase shift modules, which then send energy into the various emitting elements. To implement the outphasing transmitter for a passive ESA, the input signal is first separated into a pair of signals A and B (corresponding to the "− delta" and "+ delta" phase shifted signals as described above) and provided to an outphasing amplifier 502. The output of the outphasing amplifier 502 is provided to a splitter 504 and a network of phase shifters and variable attenuators 506 for the various emitting elements. It is contemplated that utilizing the outphasing power amplifier 502 in a passive ESA in this manner allows the output power of the ESA to be adjusted by adjusting the "delta phase" as previously described.

It is understood that the present disclosure is not limited to any underlying implementing technology. The present disclosure may be implemented utilizing any combination of software and hardware technology. The present disclosure may be implemented using a variety of technologies without departing from the scope and spirit of the disclosure or without sacrificing all of its material advantages.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

It is believed that the present disclosure and many of its attendant advantages will be understood by the foregoing description, and it will be apparent that various changes may be made in the form, construction, and arrangement of the components thereof without departing from the scope and spirit of the disclosure or without sacrificing all of its material advantages. The form herein before described being merely an explanatory embodiment thereof, it is the intention of the following claims to encompass and include such changes.

What is claimed is:

1. An outphasing transmitter for an antenna, the antenna including a plurality of emitting elements, the outphasing transmitter comprising:
    a phase shifting device, the phase shifting device configured for phase shifting an input signal and providing a pair of phase shifted signals for each particular emitting element of the plurality of emitting elements, wherein the pair of phase shifted signals for each particular emitting element includes a first signal generated by phase shifting the input signal by an offset phase for the particular emitting element minus a delta phase and a second signal generated by phase shifting the input signal by the offset phase for the particular emitting element plus the delta phase, wherein the offset phase for each emitting element is adjustable to facilitate beam steering for the antenna, and wherein the delta phase is adjustable to change output power of the antenna; and
    an outphasing power amplifier associated with each emitting element, the outphasing power amplifier configured for separately amplifying the pair of shifted signals for each emitting element and combining the separately amplified signals for each emitting element for transmission.

2. The outphasing transmitter of claim 1, wherein the phase shifting device applies the offset phase on the input signal to generate an offset phase shifted signal for the particular emitting element, and then applies the delta phase on the offset phase shifted signal to generate the pair of phase shifted signals for the particular emitting element.

3. The outphasing transmitter of claim 1, wherein the phase shifting device applies the delta phase on the input signal to generate a pair of delta phase shifted input signals, and then applies the offset phase to each of the pair of delta phase shifted input signals to generate the pair of phase shifted signals for the particular emitting element.

4. The outphasing transmitter of claim 1, wherein the delta phase is set based on a maximum power-added efficiency.

5. The outphasing transmitter of claim 1, wherein the delta phase is set to provide a desired output power of the antenna.

6. The outphasing transmitter of claim 1, wherein the antenna is an active electronically scanned array (ESA).

7. An antenna, comprising:
    a plurality of emitting elements;
    a phase shifting device, the phase shifting device configured for phase shifting an input signal and providing a pair of phase shifted signals for each particular emitting element of the plurality of emitting elements, wherein the pair of phase shifted signals for each particular emitting element includes a first signal generated by phase shifting the input signal by an offset phase for the particular emitting element minus a delta phase and a second signal generated by phase shifting the input signal by the offset phase for the particular emitting element plus the delta phase, wherein the offset phase for each emitting element is adjustable to facilitate beam steering for the antenna, and wherein the delta phase is adjustable to change output power of the antenna; and
    an outphasing power amplifier associated with each emitting element, the outphasing power amplifier configured for separately amplifying the pair of shifted signals for each emitting element and combining the separately amplified signals for each emitting element for transmission.

8. The antenna of claim 7, wherein the delta phase is set based on a maximum power-added efficiency.

9. The antenna of claim 7, wherein the delta phase is set to provide a desired output power of the antenna.

10. The antenna of claim 7, wherein the antenna is an electronically scanned array (ESA).

11. An amplification method, the method comprising:
    phase shifting an input signal and providing a pair of phase shifted signals for each particular emitting element of a plurality of emitting elements of an antenna, wherein the pair of phase shifted signals for each particular emitting element includes a first signal generated by phase shifting the input signal by an offset phase for the particular emitting element minus a delta phase and a second signal generated by phase shifting the input signal by the offset phase for the particular emitting element plus the delta phase, wherein the offset phase for each emitting element is adjustable to facilitate beam steering for the antenna, and wherein the delta phase is adjustable to change output power of the antenna;
    separately amplifying the pair of shifted signals for each emitting element; and
    combining the separately amplified signals for each emitting element for transmission.

12. The method of claim 11, wherein the antenna is an electronically scanned array (ESA).

* * * * *